(12) United States Patent
Chen et al.

(10) Patent No.: US 6,810,758 B2
(45) Date of Patent: *Nov. 2, 2004

(54) APPARATUS AND METHOD FOR AUTOMATICALLY CHANGING THE PROBE HEAD IN A FOUR-POINT PROBE SYSTEM

(75) Inventors: James T. Chen, San Mateo, CA (US); Gong Wang, Hayward, CA (US)

(73) Assignee: Four Dimensions, Inc., Hayward, CA (US)

( * ) Notice: Subject to any disclaimer, the term of this patent is extended or adjusted under 35 U.S.C. 154(b) by 14 days.

This patent is subject to a terminal disclaimer.

(21) Appl. No.: 10/197,155

(22) Filed: Jul. 16, 2002

(65) Prior Publication Data

US 2003/0005783 A1 Jan. 9, 2003

Related U.S. Application Data

(63) Continuation-in-part of application No. 09/389,687, filed on Sep. 2, 1999, now Pat. No. 6,435,045.
(60) Provisional application No. 60/099,139, filed on Sep. 4, 1998.

(51) Int. Cl.$^7$ ............................................. G01M 19/00
(52) U.S. Cl. .................................................... 73/866.5
(58) Field of Search ....................... 73/866.5; 702/127; 33/557; 324/754

(56) References Cited

U.S. PATENT DOCUMENTS

| | | | |
|---|---|---|---|
| 2,913,963 A | 11/1959 | De Boer et al. | 33/18.1 |
| 4,069,590 A | 1/1978 | Effinger | 33/523 |
| 4,637,119 A | 1/1987 | Schneider et al. | 29/568 |
| 5,073,912 A | 12/1991 | Kobayashi et al. | 378/34 |
| 5,157,847 A | 10/1992 | Perks | 33/836 |
| 5,471,148 A | 11/1995 | Sinsheimer et al. | 324/754 |
| 5,593,341 A | 1/1997 | Gonnella et al. | 451/57 |
| 5,708,222 A | 1/1998 | Yonezawa et al. | 73/865.8 |
| 5,795,990 A | 8/1998 | Gitis et al. | 73/9 |
| 5,844,149 A | 12/1998 | Akiyoshi et al. | 73/864.81 |
| 5,883,313 A | 3/1999 | Ercole et al. | 73/865.8 |
| 6,040,699 A | 3/2000 | Holmes | 324/754 |
| 6,166,550 A | 12/2000 | Abramsohn et al. | 324/452 |
| 6,522,158 B1 * | 2/2003 | Fung et al. | 321/76.5 |

FOREIGN PATENT DOCUMENTS

| | | | |
|---|---|---|---|
| DE | 2204955 | 8/1973 | B24B/7/16 |
| JP | 2-74843 | 3/1990 | 324/754 |
| JP | 5144898 | 6/1993 | 73/866.5 |

* cited by examiner

Primary Examiner—Thomas P. Noland
(74) Attorney, Agent, or Firm—Allston L. Jones

(57) ABSTRACT

Provided is a test system and method that permits automatically interchanging a plurality of tools to seamlessly perform various functions on a sample. Each tool is mounted in an assembly and the sample is mounted on a chuck. A path is defined in a plane along which a carriage on which the tool assemblies are mounted is transported with the tools each positioned in the same attitude with respect to, and distance from, that path. The carriage is transported along the path to a position where one of the tools is adjacent the chuck which is rotated, if necessary, to position a desired point of interest on the sample immediately adjacent the tool. Once positioned, the tool engages the sample to perform a test. Following testing, the tool is disengaged from the sample and the process repeated as necessary for each additional test to be performed on the sample. Thus, the apparatus and method of the present invention enables the sample on the chuck to be tested by any of the tools in the system at any site on the surface of the sample by transporting the tools and rotating the chuck to position the various tools adjacent desired points on the sample. Therefore, automatic changing of the tool among those installed in the system can be performed seamlessly saving valuable time and resources during production of various items. Notice that the sample-under-test can be changed by a robot in a larger system when the chuck is in a home position and the carriage and tools have been retracted along the defined path to clear the top surface of the sample from obstruction during the changing process.

16 Claims, 9 Drawing Sheets

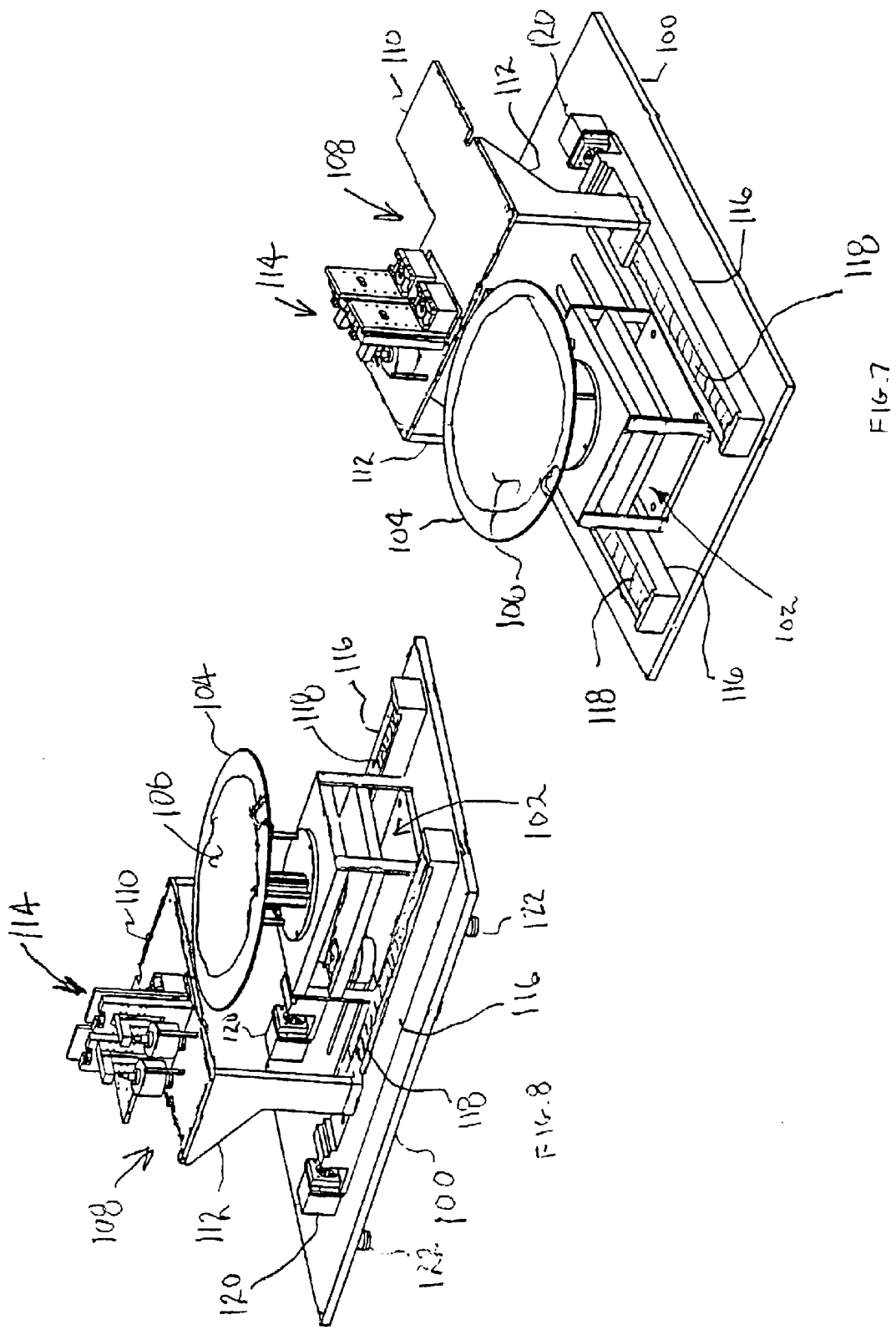

APPARATUS AND METHOD FOR AUTOMATICALLY CHANGING THE PROBE HEAD IN A FOUR-POINT PROBE SYSTEM

CROSS-REFERENCE

This patent application is a Continuation-In-Part application from the application having the same title that was given Ser. No. 09/389,687 and was filed on Sep. 2, 1999, in the U.S. Patent and Trademark Office and now U.S. Pat. No. 6,435,045 which in turn claims priority from an earlier filed Provisional Patent Application having Ser. No. 60/099,139 that was filed on Sep. 4, 1998.

BACKGROUND OF THE INVENTION

1. Field of the Invention

This invention relates to four-point systems and the ability to automatically change testing probe heads in-between two sample tests if a different probe head is required for the next test to be performed.

2. Description of the Background Art

Four-point probe systems are commonly used in device fabrications for monitoring processes such as metal film deposition and ion implantation. This is performed by measuring sheet resistivities of a test wafer processed with the wafer on which micro-devices are being manufactured for comparison to expected sheet resistivities. In the semiconductor industry if a first test was performed on a wafer with a metal film, and the next test to be performed is on ion-implanted wafer, it usually is necessary to change the probe head to get the best measurement results and avoiding cross contamination.

Up to now, changing of probe heads has been done manually for all four-point probe systems. Even in a fully automatic cassette-to-cassette system, there is only one probe head is installed in the system, and there is no provision for automatically changing that single probe head as the types of tests that need to be performed vary. There too that probe head must be changed manually. Changing probe heads is not only time consuming, but also makes it easy to introduce contaminating particles into the system's mini-environment. Furthermore, mistakes may also happen in changing the probe heads. The present invention overcomes each of these short comings of the prior art.

SUMMARY OF THE INVENTION

The present invention provides a test head system and method that permits the automatic interchange of a plurality of tooling as desired to perform various functions on a sample.

A first embodiment of the test head system of the present invention includes a frame with a base and a panel extending upward from the base. Mounted on the base is a fixed track that defines a travel path along which a carriage is supported and moved, the carriage in turn having a chuck rotationally mounted to support the sample. Additionally there is a rotational mechanism coupled to the chuck and carriage to position the chuck to a desired rotational position, and a drive mechanism attached to the carriage to move the carriage to a desired position along the fixed track. Also included is a plurality of tooling assemblies each affixed to the panel in a position relative to the fixed track to provide a tool opposite any point on the sample as the chuck is advanced and rotated to a position opposite any of the tooling assemblies. Note that the rotational and drive mechanisms are powered in conjunction with each other to position a desired point on the sample beneath a desired one of the tooling assemblies.

A first embodiment of the method of the present invention is provided to test a sample with a plurality of tools with each tool mounted in a separate tooling assembly and the sample to be tested mounted on a rotationally mounted chuck. The method is performed by defining a path in a plane along which the chuck is to be transported and positioning a plurality of tooling assemblies along that path, with each tooling assembly being positioned in a same attitude with respect to, and at a same distance from, the path. then the method includes transporting the chuck along the path to a position adjacent one of the tooling assemblies and rotating the chuck, if necessary, to position a point of interest on the sample immediately adjacent the tool of one of the tooling assemblies. Once positioned, the method proceeds with engaging the tool adjacent the sample with the sample and performing a test on the sample with the engaged tool. Following the testing the method proceeds with disengaging the tool from the sample and repeating the transporting, rotating, engaging, testing and disengaging steps as necessary for each additional test to be performed on the sample by the same or a different tool.

Thus, the first embodiment apparatus and method of the present invention enables the sample on the chuck to be tested by any of the tools in the system at any site on the surface of the sample through transporting and rotating the chuck to a position adjacent the needed tool for the test at hand. Therefore, automatic changing of the tool among those installed in the system can be performed seamlessly saving valuable time and resources during production of various items. Notice that the sample-under-test can be changed by a robot in a larger system when the chuck is at a position along the defined path that is not located beneath a tool assembly.

A second embodiment of the test head system of the present invention includes a base with a fixed track mounted thereon to define a travel path. A chuck is also rotationally mounted on the base to support the sample to be tested with the chuck in a fixed position relative to the track and a rotational mechanism coupled to the chuck rotate the chuck in opposing directions to a desired rotational position. Mounted on the fixed track is a carriage with a drive mechanism coupled to the carriage and the track to move the carriage in opposing directions along the track to a desired position. Also included is a plurality of probe assemblies each affixed to the carriage in a position relative to the fixed track to provide a probe opposite any point on the sample as the carriage is advanced and the chuck rotated, as necessary. In this embodiment, as in the first embodiment, the rotational mechanism and the drive mechanism are powered in conjunction with each other to position a desired probe opposite a desired point on the sample.

A second embodiment method of the present invention is provided to test a sample with a plurality of tools with each tool mounted in a separate tooling assembly and the sample to be tested mounted on a rotationally mounted chuck. The method is performed by defining a path in a plane along which the plurality of tools are to be transported and the tooling assemblies positioned along that path, with each tooling assembly being positioned in the same attitude with respect to, and at a same distance from, the path. Then the method includes transporting the tooling assemblies along the path to position one of the tooling assemblies above the sample on the chuck and rotating the chuck, if necessary, to position a point of interest on the sample immediately adjacent the tool of one of the tooling assemblies. Once positioned, the method proceeds with engaging the tool adjacent the sample with the sample and performing a test on the sample with the engaged tool. Following the testing the method proceeds with disengaging the tool from the sample and repeating the transporting, rotating, engaging, testing and disengaging steps as necessary for each additional test to be performed on the sample by the same or a different tool.

Thus, the apparatus and method of second embodiment of the present invention enables the sample on the chuck to be tested by any of the tools in the system at any site on the surface of the sample through transporting the tools and rotating the chuck to a position adjacent the needed tool for the test at hand. Therefore, automatic changing of the tool among those installed in the system can be performed seamlessly saving valuable time and resources during production of various items. Notice that the sample-under-test can be changed by a robot in a larger system when the various tools are clear of the chuck.

BRIEF DESCRIPTION OF THE DRAWINGS

FIG. 7 is a top left side perspective view of a second embodiment of an automatic probe head changing mechanism of the present invention with the test probe carriage in a home position;

FIG. 8 is a top right side perspective view of the second embodiment of an automatic probe head changing mechanism of the present invention with the probe carriage in a home position;

DETAILED DESCRIPTION OF AN EMBODIMENT OF THE PRESENT INVENTION

Figure 1:
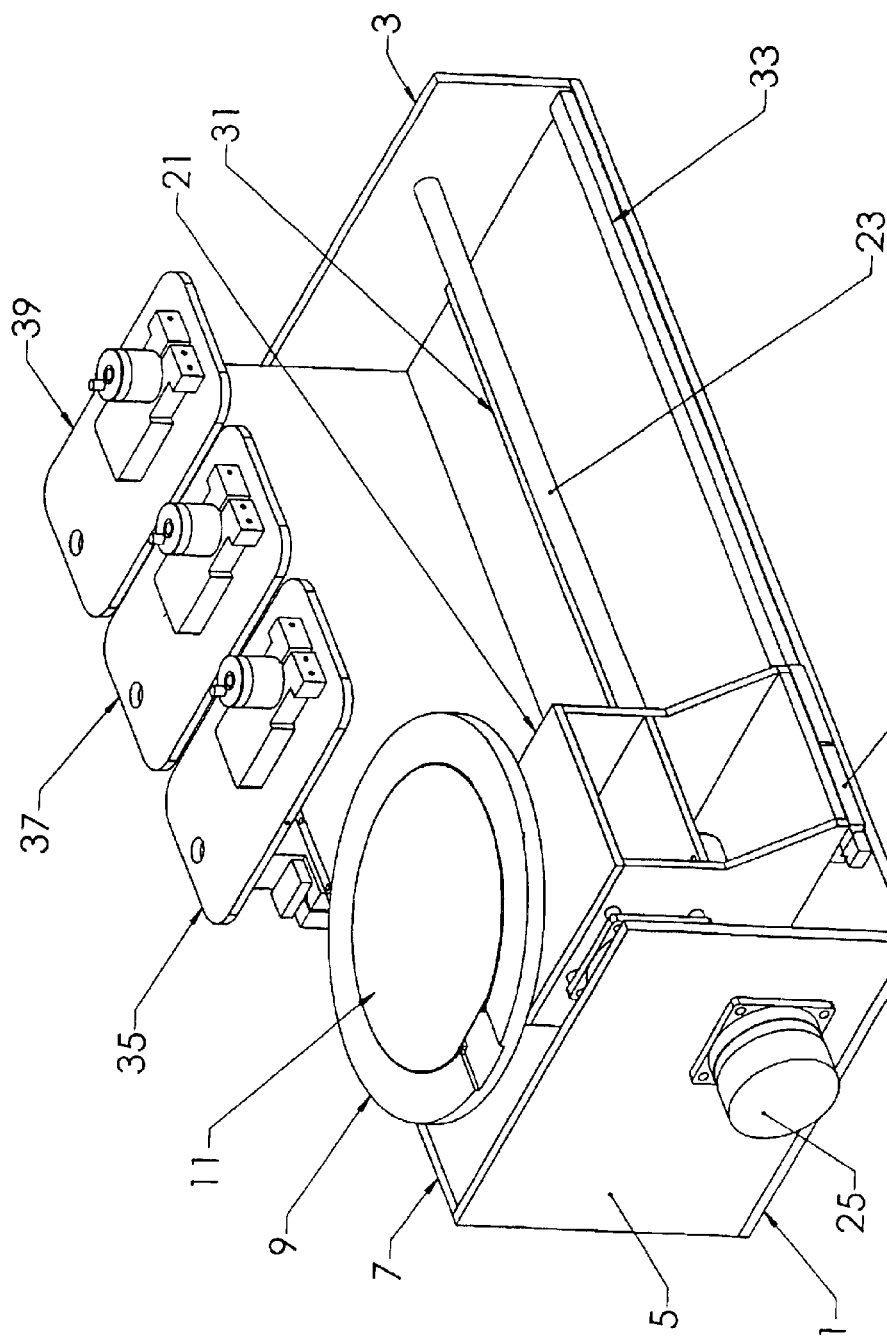
FIG. 1 is a top left side perspective view of a first embodiment of an automatic probe head changing mechanism of the present invention with the chuck in a home position.
Figure 2:
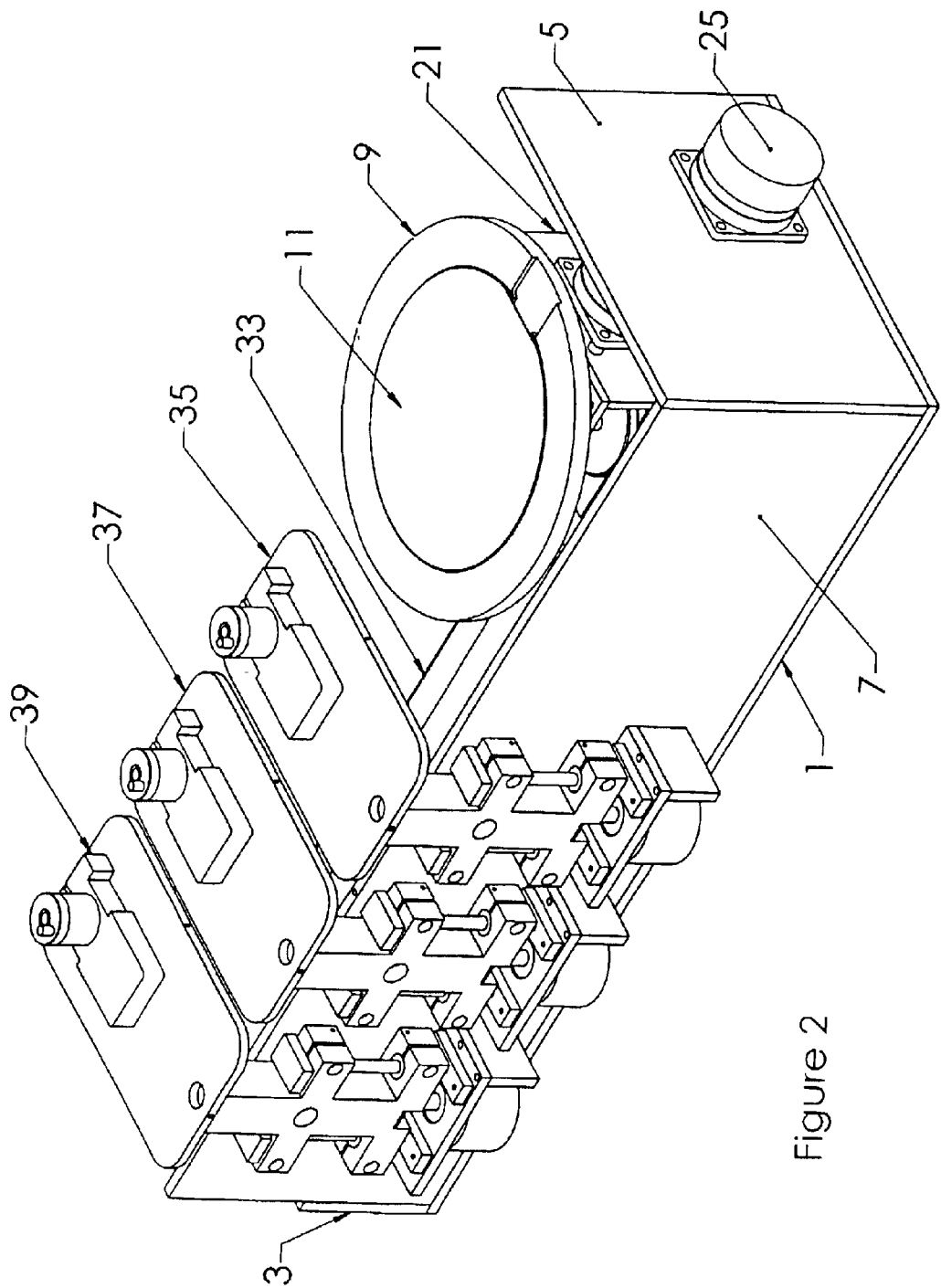
FIG. 2 is a top right side perspective view of the first embodiment of an automatic probe head changing mechanism of the present invention with the chuck in a home position.
Figure 3:
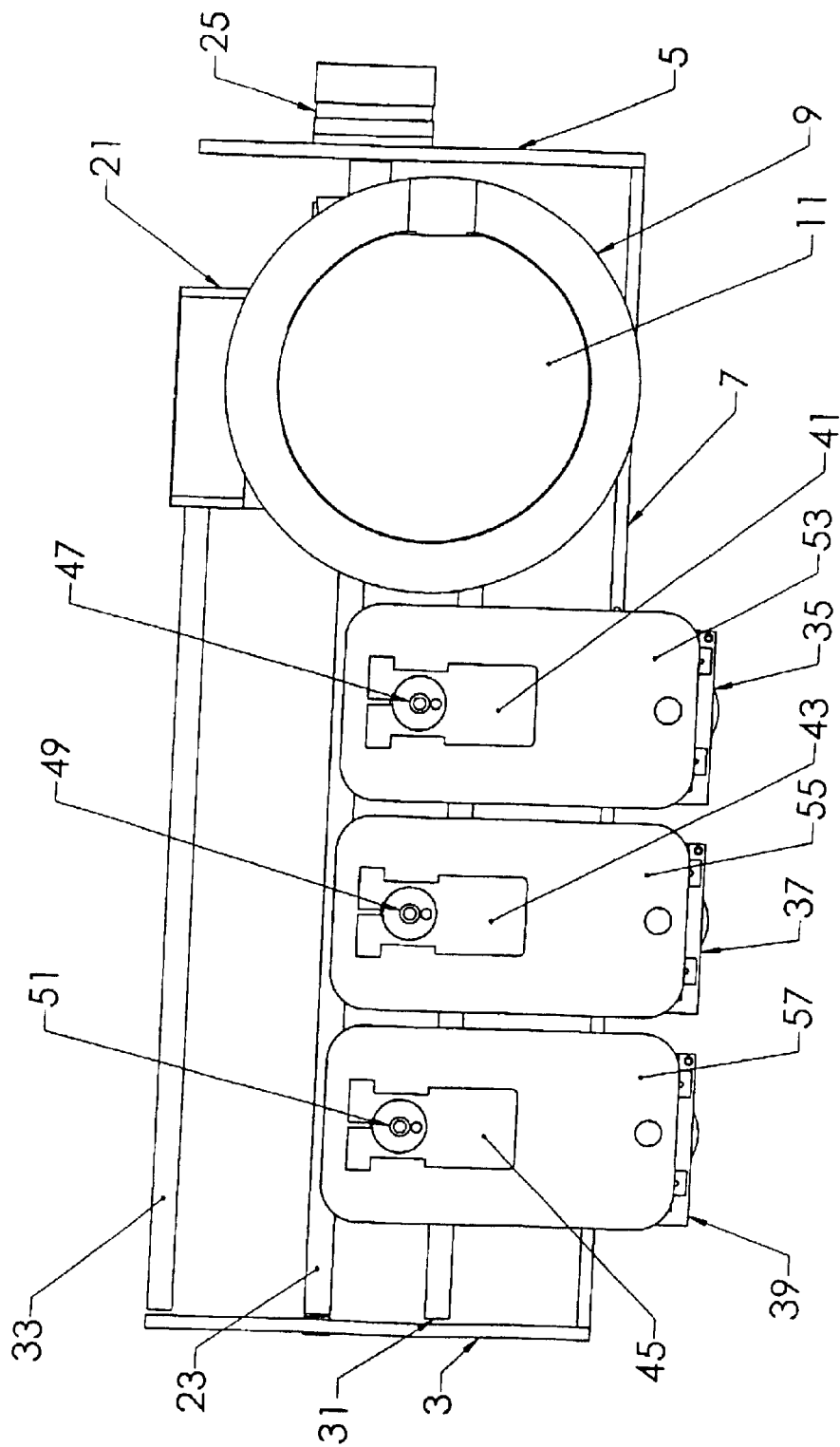
FIG. 3 a top view of the automatic probe head changing mechanism of FIGS. 1 and 2 with the chuck in the home position of FIGS. 1 and 2.

FIGS. 1 through 4 show various views of the chuck and probe head mechanism of a first embodiment of the present invention for automatically changing probe heads that interface with a chuck holding a wafer for different types of tests on the wafer. The assembly includes base plate 1 on which end plates 3 and 5, and probe support panel 7 are mounted vertically with end plates 3 and 5 mounted perpendicularly to opposite ends of probe support panel 7. Oriented horizontally intermediate end plates 3 and 5 is chuck 9, the underside of which extends above probe support panel 7 with chuck 9 being provided to support a wafer 11 (e.g., a semiconductor wafer). In turn, chuck 9 is supported on a central shaft 13 about which chuck 9 is turned with shaft 13 being turned selectively by stepper motor 15 via shaft 17 and gear assembly 19, all of which are supported by carriage 21.

Carriage 21 in turn has affixed to the bottom thereof two sets of block mounts 29 which individually rest on linear guide rails 31 and 33 to support carriage 21. Each of guide rails 31 and 33 are affixed to base plate 1 to provide a linear track along which carriage 21 is selectively advanced to move chuck 9 to a desired position. To provide the motivating force to carriage 21, stepper motor 25 is mounted on the outside of end plate 5 with the motor shaft extending through end plate 5. Attached to the shaft of stepper motor 25 is coupling 24 which in turn is attached to the proximate end of ball screw 23 with the distal end of ball screw 23 mounted in a bearing in end plate 3. Between end plates 3 and 5, ball screw 23 extends through carriage 21 and ball nut 27 that is affixed to carriage 21. Thus, stepper motor 25 selectively turns ball screw 23 which in turn moves carriage 21 by means of attached ball nut 27.

Probe support assemblies 35, 37 and 39 are mounted on the outer side of probe support panel 7 with probe support plates 53, 55 and 57, respectively, extending across probe support panel 7 and above the track of chuck 9. Within the end that extends over the track of chuck 9, each of probe support plates 53, 55 and 57 includes probe mount blocks 41, 43 and 45, respectively, with probes 47, 49 and 51 pointing vertically downward and contained within a respective one of probe mount blocks 41, 43 and 45.

Figure 4:
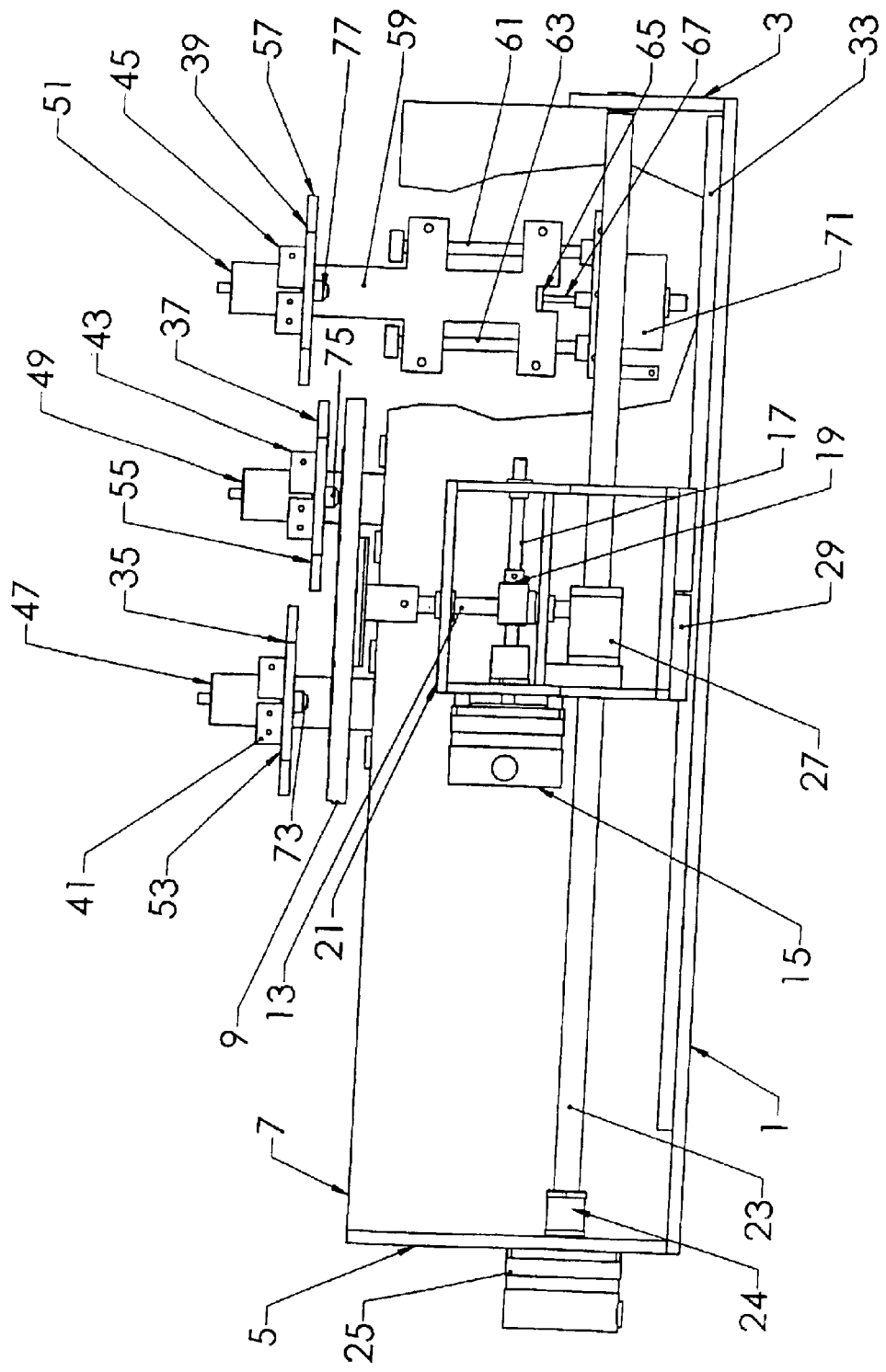
FIG. 4 is a left side view of the automatic probe head changing mechanism of FIGS. 1 and 2 with the chuck opposite the second probe head.

Referring now specifically to FIG. 4, carriage 21 is shown advanced to a position with chuck 9 located immediately beneath probe 49. Additionally a portion of probe support panel 7 has been cut away with the third probe support assembly 39, which is normally attached to the portion of panel 7 that has been cut away, shown in place as if the cut-away had not been made. Probe support assembly 39 includes probe support plate 57 secured to the top of lower arm 59. Lower arm 59 in turn is slidably mounted on vertical shafts 61 and 63. At the lower end of lower arm 59 there is a horizontal flange 65 extending into the page (shown with a broken outline) that is in contact with plunger 67 of electromagnetic actuator 71. Therefore, by varying the activation signal to actuator 71, raising or lowering lower arm 59, probe tip 77 can be raised or lowered. Each of probe support assemblies 35 and 37 are similarly constructed and controlled.

Upon further examination of FIG. 4 it can be seen that probe tip 75 of the second probe support assembly 37 is in the lower position for performing tests on wafer 11 on chuck 9, while probe tip 73 of the first probe support assembly 35, like probe tip 77 of probe support assembly 39, is in the up position. Since chuck 9 Is only positioned for testing beneath one probe at a time, only one of probe tips 73, 75 and 77 can be down at any one time, thus the default position of each probe tip is the up position until chuck 9 has been moved into position beneath a particular one of the probe tips and wafer 11 has been positioned for testing.

Figure 5:
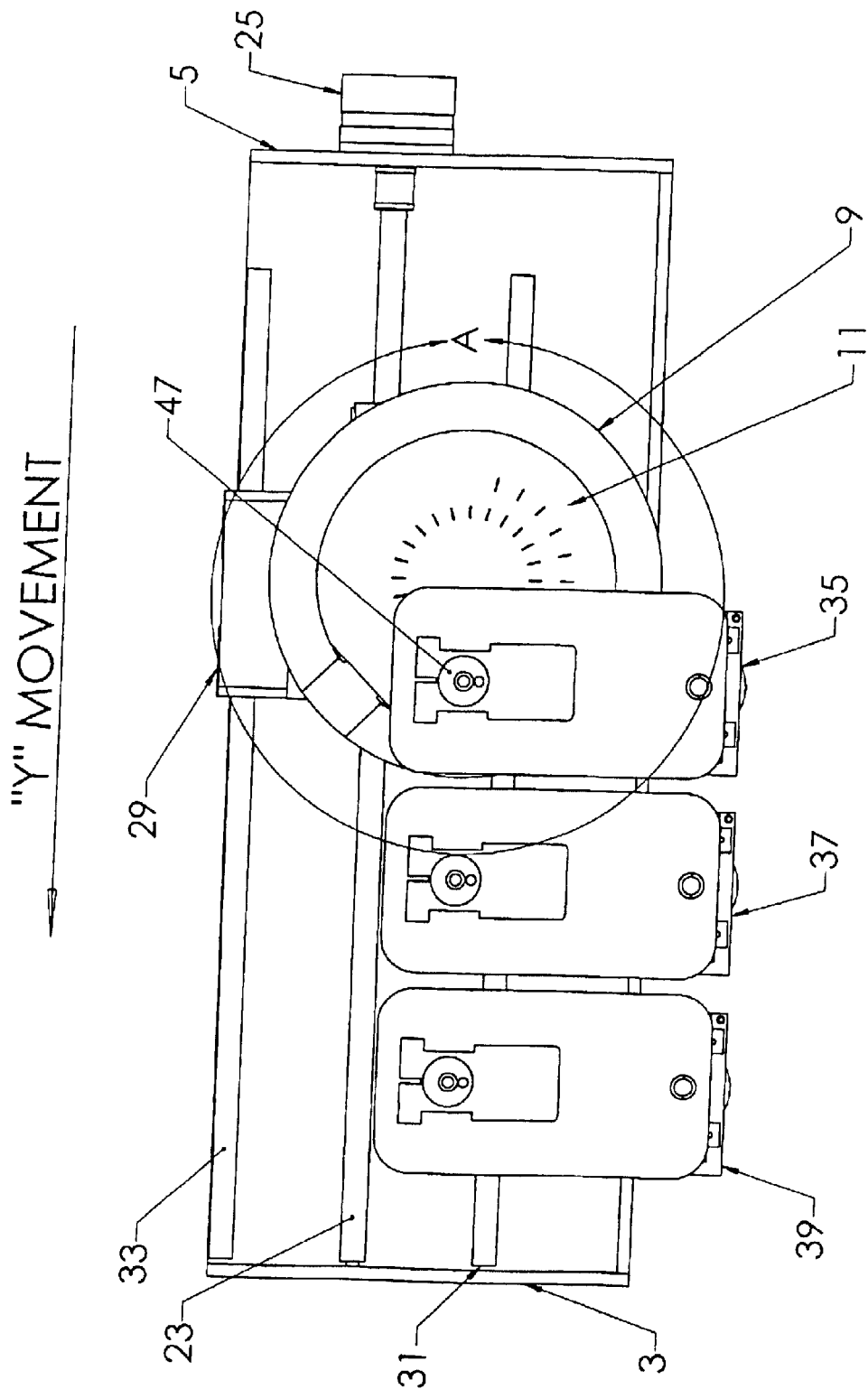
FIG. 5 is a top view of the automatic probe head changing mechanism of FIGS. 1 and 2 with the chuck positioned to permit a selected point on the sample on the chuck to be opposite the first probe head.
Figure 6:
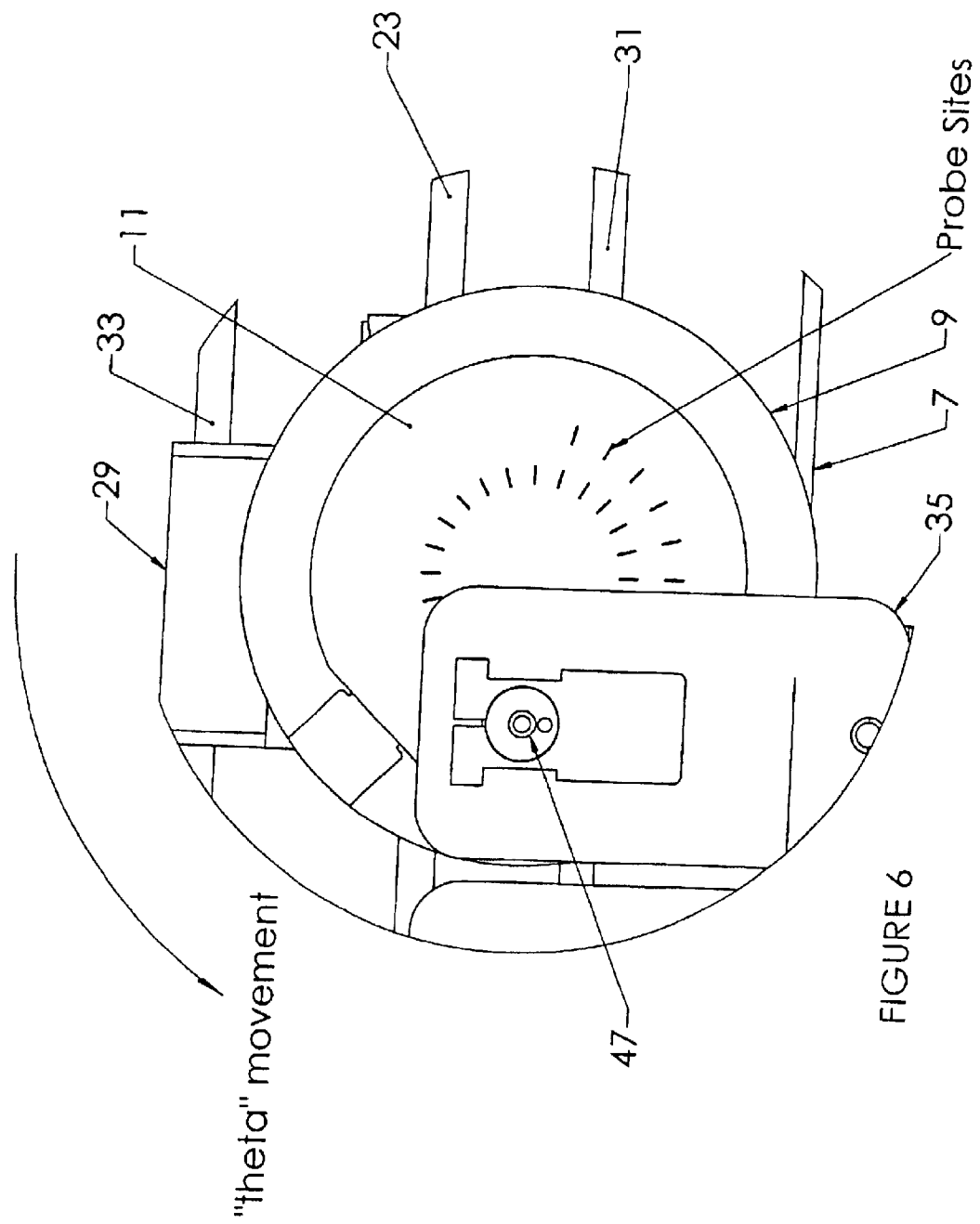
FIG. 6 is a close-up top view of the automatic probe head changing mechanism of FIG. 5 with the chuck positioned to permit a selected point on the sample on the chuck to be engaged by the first probe head.
Figure 9:
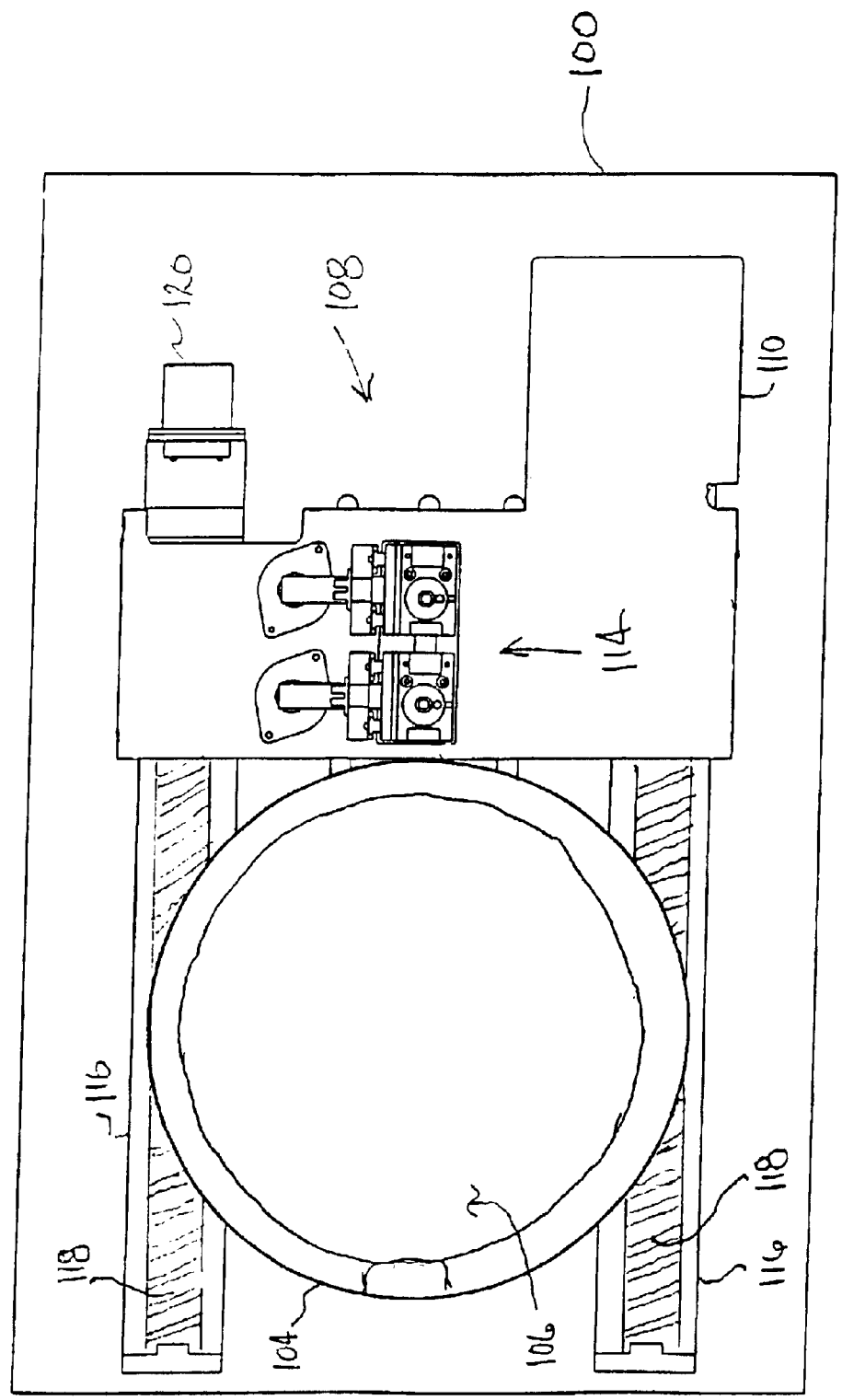
FIG. 9 a top view of the automatic probe head changing mechanism of FIGS. 7 and 8 with the probe carriage in the home position of FIGS. 7 and 8.
Figure 10:
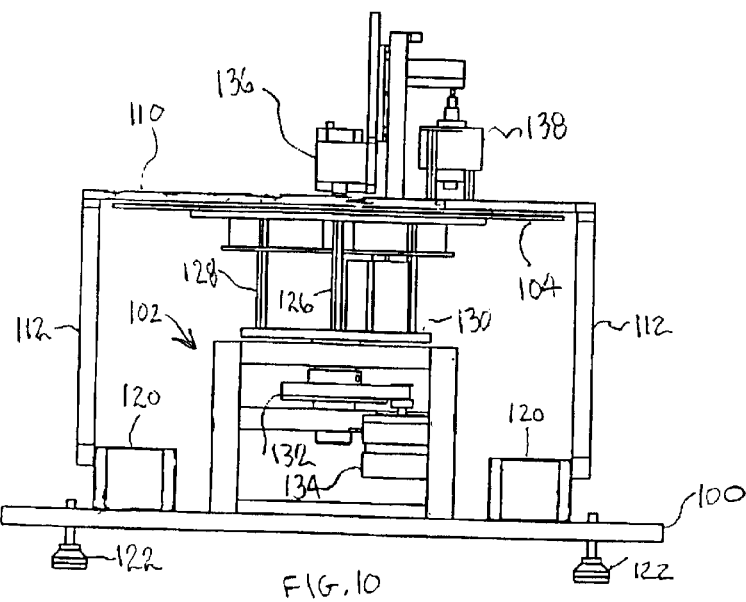
FIG. 10 is a back side view (the unshown view in FIGS. 7 and 8) of the automatic probe head changing mechanism of FIGS. 7 and 8.
Figure 11:
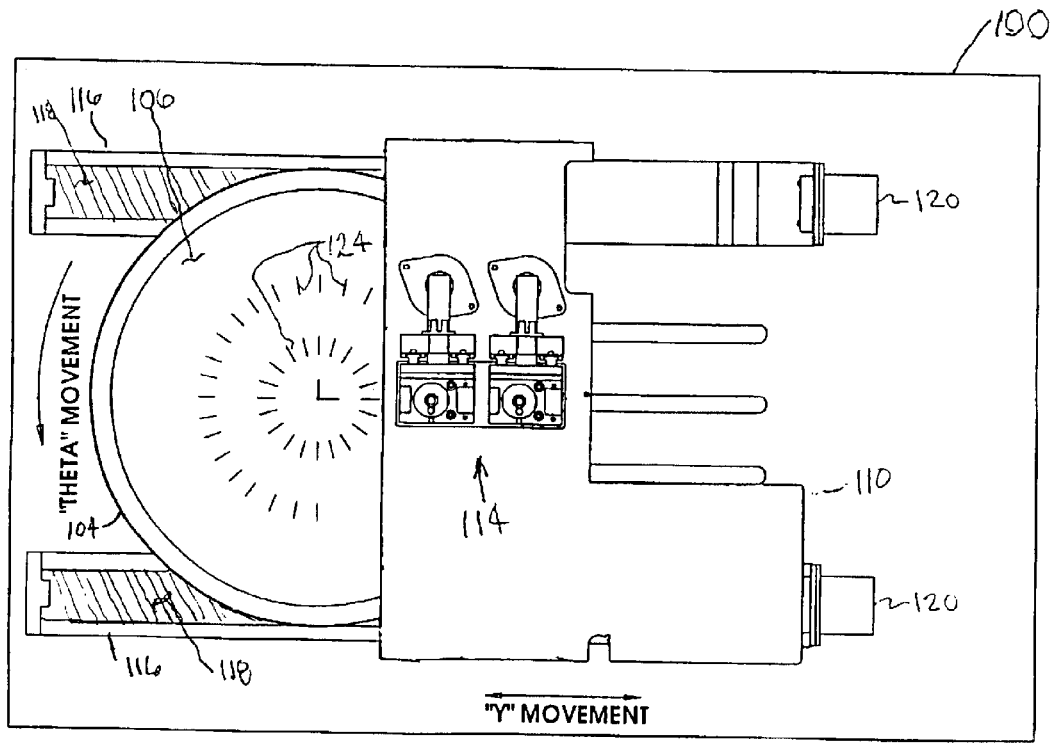
FIG. 11 is a top view of the automatic probe head changing mechanism of FIGS. 7 and 8 with the probe carriage positioned to permit a probe head to interface with a selected position on the sample.

FIG. 5 is a simplified top view of the chuck and probe head mechanism of the present invention with chuck 9 having been advanced along linear guide rails 31 and 33 in the Y-direction from the home position to place wafer 11 beneath the first probe 47. FIG. 6 shows a close-up of the positioning of chuck 9 with wafer 11 beneath probe 47 as shown in FIG. 5. From FIGS. 4 and 6 it can thus be seen that wafer 11 may be rotationally positioned as desired beneath probe 47 by activating stepper motor 15. While FIGS. 5 and 6 only show wafer 11 opposite probe 47, it is also clear that wafer 11 can be similarly positioned beneath probes 49 and 51.

In summary, when a sample is to be tested with the first embodiment of the present invention, the sample is placed on chuck 9 with chuck 9 in the loading, or home, position as shown in FIG. 1. Then chuck 9 can be linearly transported with stepper motor 25 and rotated angularly with stepper motor 15 into position so that the desired test spot on wafer 11 is beneath the desired probe. Then the selected probe head is lowered into position above the test point on wafer 11 by activation of the actuator that corresponds to the selected probe head (e.g., in FIG. 4 probe head 75 is controlled with an actuator that is not shown similar to actuator 71 that controls probe head 77). The entire operation can thus be controlled for positioning the same spot on the sample-under-test beneath a selected probe, as well as controlling the test itself. Computer-controlled automatic changing of the probe head for testing is thus realized.

The second embodiment of the present invention is shown in FIGS. 7–11. Whereas in the first embodiment the chuck is mounted on the carriage and the probe assemblies are in a fixed location, in the second embodiment the probe assemblies are mounted on the carriage and the chuck assembly is in a fixed location.

FIGS. 7 through 11 show various views of the chuck and probe head mechanism of the second embodiment of the present invention for automatically changing probe heads that interface with a chuck holding a sample, or wafer, for different types of tests on the wafer. The assembly includes a base plate 100 supported on mounting feet 122 with a chuck assembly 102 centrally fixedly mounted to base plate 100 near the front edge thereof with linear guide rails 116 mounted parallel to each other on either side of chuck assembly 102 and with the guide rails 116 extending past the chuck assembly 102 toward the back edge of base plate 100.

Chuck assembly 102 (FIG. 10) includes a chuck 104 mounted parallel to, and above, base plate 100 a fixed distance. Beneath chuck 104 is a stabilization cage consisting of at least three vertically positioned struts 128 having one end of each attached to the chuck 104 and extending away therefrom to a stabilization plate 130 having a central hole therethrough. Attached in the center of chuck 104 is a downward extending shaft 126 that passes through the center hole in stabilizing plate 130 and attaches to drive assembly 132 that is driven by chuck positional stepper motor 134.

Included within each of the linear guide rails 116 is a ball screw 118 with the proximate end mounted in a bearing (not shown) within each guide rail 116 and the distal end of each ball screw is attached to a separate servo drive motor 120. Mounted on guide rails 116 is carriage 108 that includes a pair of legs 112 extending vertically upward, one mounted to each guide rail 116, with a platform 110 attached to the top of each of legs 112 with platform 110 spaced apart and parallel to base plate 100 by a distance that is greater than the distance that chuck 104 is above base plate 100. Attached to the bottom of each of legs 112 is a ball nut (not shown) that is threaded on each ball screw 118, respectively, within guide rails 116. Thus, when servo drive motors 120 are activated, ball screws 118 turn and advance the ball nuts 116 in one direction or the other to position platform 110 above chuck 104. In this configuration, servo motors 120 have to be matched and driven with the same signal to position carriage 108 at the desired location. Alternatively, each of ball screws 118 could be driven with a single servo motor 120' through a gear train that is equalized to provide the same angular rotation to each of ball screws 118.

Mounted on platform 110 are at least two test probe assemblies 114 each having a different tool to be used for testing wafer 106 when carriage 108 is positioned above chuck 104 and chuck 104 rotated to position the desired probe site beneath the desired test probe similar to that describe above with respect to FIG. 6. To permit the testing of wafer 106 with the various probes on platform 110, each probe assembly is oriented such that each included tool is alined with a virtual line that passes through the center of chuck 104 and is parallel to the two guide rails 116. Also, platform 110 includes a hole (not shown) beneath the tool in each probe assembly to permit the tool to extend through the corresponding hole to access the desired probe site on wafer 106 when the carriage is positioned above chuck 104 and chuck 104 is rotated, if necessary, to position the desired probe site opposite the desired tool. Each hole through platform 110 is sized and shaped to provide passage and working room for any and every tool that might be used to test wafer 106. By so sizing those holes, when it is necessary to change tools it is only necessary to change the tool in the probe assemblies rather than the entire platform or carriage.

In summary, when a sample is to be tested with the second embodiment of the present invention, the sample is placed on chuck 104 with chuck 104 in the loading, or home, position as shown in FIG. 7. Then carriage 108 is linearly transported via ball screws 118 driven by stepper motors 120 and chuck 104 rotated angularly with stepper motor 134 to position the desired test spot, or probe site, on wafer 106 beneath the desired probe. Then the selected probe head is activated to advance the probe to the probe site similar to that shown in FIG. 4 for the first embodiment of the present invention. The entire operation can thus be controlled for positioning the same spot on the sample-under-test beneath a selected probe, as well as controlling the test itself. Computer-controlled automatic changing of the probe head for testing is thus realized, as is the positioning of the probe relative to various probe sites on the wafer 106.

While the specific embodiments discussed above with respect to the included figures shows a system having two or three probe test stations, that number can clearly be extended to any desired number of test stations and incorporate any variety of probes desired. Additionally, while the guide rails have been shown to have a rectangular cross-section in the figures, the cross-sectional shape of the rails can have any shape (e.g., circular, half-circular, elliptical, half elliptical, triangular, etc.), and only one rail or more than two rails may also be used depending on the stability required. Further, while the system of the present invention has been shown in the figures as being linearly oriented and mounted on straight rails, the rails could take any shape (e.g., curved, snake like, etc.) to position the wafer relative to a selected probe head using a chain or cable drive to move the carriage into position. Also, while the motive devices have been described as stepper motors and electromagnetic actuators, they are merely a matter of design choice and other types of motive devices could be used instead to meet the requirements of the tests and necessary configuration of the test system.

While the present invention has been describe in the two embodiments of the figures, the present invention is not limited to those designs. Seeing the design disclosed here, one skilled in the mechanical arts could easily make alternative equivalent designs, thus the present invention and the coverage provided here is only to be limited by the scope of the accompanying claims.

What is claimed is:

1. A test head system to permit the automatic interchange of a plurality of probes as desired to perform various functions on a sample, said test head system comprising:

a base;

a fixed track mounted on said base to define a travel path along said fixed track;

a carriage supported on said fixed track;

a chuck rotationally mounted on one of said carriage and said base to support said sample;

a rotational mechanism coupled to said chuck to rotationally move said chuck in opposing directions to a desired rotational position;

a drive mechanism attached to said carriage to move said carriage in opposing directions to a desired position along said fixed track; and a plurality of probe assemblies each affixed to the other one of said carriage and said base other than the one to which said chuck is mounted, said probe assemblies mounted in a position to provide a probe opposite any point on said sample as said carnage is advanced and said chuck is rotated to a position opposite any of said probes;

wherein said rotational mechanism and said drive mechanism are powered in conjunction with each other to position a desired point on said sample beneath a desired one of said probes.

2. A test head system to permit the automatic interchange of a plurality of probes as desired to perform various functions on a sample, said test head system comprising:

a base;

a fixed track mounted on said base to define a travel path along said fixed track;

a carriage supported on said fixed track;

a chuck rotationally mounted on said base to support said sample;

a rotational mechanism coupled to said chuck and said base to rotate said chuck in opposing directions to a desired rotational position;

a drive mechanism coupled to said carriage and said track to move said carriage in opposing directions along said track to a desired position; and a plurality of probe assemblies each affixed to said carriage in a position relative to said fixed track to provide a probe opposite any point on said sample as said carriage is advanced and said chuck is rotated, as necessary;

wherein said rotational mechanism and said drive mechanism are powered in conjunction with each other to position a desired probe opposite a desired point on said sample.

3. The test head system as in claim 2 wherein each probe assembly includes:

a test head including a probe for use with said sample;

a test head support mounted on said carriage to hold said test head and probe in a default position extended away from a plane defined by a top surface of said chuck as said carriage is moved along said fixed track; and an actuation subsystem coupled to said test head support to advance said test head to said sample when said test head is positioned opposite said sample for use of said probe on said sample and to retract said test head to, and maintain at, said default position when said probe is not in use.

4. The test head system as in claim 2 wherein:

said chuck includes a downwardly extending centrally located shaft about which said chuck can be rotated; and said rotational mechanism includes a stepper motor coupled to said shaft of said chuck to control the rotational position of said chuck.

5. The test head system as in claim 2 wherein said drive mechanism includes a motor and transmission subsystem to control the position of said carriage along said fixed track.

6. The test head system as in claim 5 wherein:

said motor is a stepper motor mounted at a first end of said fixed track; and said transmission subsystem includes:

a ball screw rotationally affixed to said fixed track with a proximate end connected to said motor and a distal end journaled at a second end of said fixed track; and a ball nut treaded on said ball screw and coupled to said carriage to provide movement of said carriage along said fixed track.

7. The test head system as in claim 6 wherein said fixed track defines a straight travel path.

8. The test head system as in claim 7 wherein said fixed track includes a plurality of parallel rails that are spaced apart from each other with each rail mounted to said base.

9. The test head system as in claim 8 wherein one of said plurality of rails includes said transmission subsystem.

10. The test head system as in claim 8 wherein said curved travel path includes different radii of curvature.

11. The test head system as in claim 2 wherein:

said fixed track includes two parallel rails that are spaced apart from each other with each rail mounted to said base;

said drive mechanism includes:

a motor subsystem coupled to each rail; and a transmission subsystem to control the position of said carriage along said fixed track affixed to each rail; and said transmission subsystem affixed to each rail includes:

a ball screw rotationally affixed to said rail with a proximate end connected to said motor subsystem and a distal end journaled at a second end of said rail; and a ball nut treaded on said ball screw and coupled to said carriage to provide movement of said carriage along said rail.

12. The test head system as in claim 11 wherein said motor subsystem includes:

a stepper motor; and a gear subsystem coupled between said stepper motor and the ball screw affixed to each rail.

13. The test head system as in claim 11 wherein said motor subsystem includes a pair of stepper motors, one for each rail.

14. The test head system as in claim 2 wherein said fixed track defines a curved travel path.

15. A test head system as in claim 2 wherein:

each probe of each of said probe assemblies has a tip that defines a point in a default plane when each probe is not in use;

each probe of each of said probe assemblies defines a central axis with all central axes parallel to each other; and each of the central axes when extended to said base are the same distance from said fixed track for all positions of said carriage.

16. The test head system as in claim 15 wherein each probe assembly includes:

a test head including a probe for use with said sample;

a test head support mounted on said carriage to hold said test head and probe in a default position extended away from a plane defined by a top surface of said chuck as said carriage is moved along said fixed track; and an actuation subsystem coupled to said test head support to advance said test head to said sample when said test head is positioned opposite said sample for use of said probe on said sample and to retract said test head to, and maintain at, said default position when said probe is not in use.

* * * * *